United States Patent [19]

Kadah

[11] 4,129,785

[45] Dec. 12, 1978

[54] SOLID STATE SWITCH

[75] Inventor: Zagloul B. Kadah, San Jose, Calif.

[73] Assignee: Monsanto Company, St. Louis, Mo.

[21] Appl. No.: 846,966

[22] Filed: Oct. 31, 1977

[51] Int. Cl.² .............................................. G02B 27/00
[52] U.S. Cl. ...................................... 250/551; 307/311
[58] Field of Search .................... 250/551, 209, 214 R; 307/311

[56] References Cited

U.S. PATENT DOCUMENTS 3,708,672  1/1973  Marinkovic ........................... 250/551
3,723,769  3/1973  Collins ................................. 307/311

*Primary Examiner*—David C. Nelms
*Attorney, Agent, or Firm*—Lawrence L. Limpus

[57] ABSTRACT

A solid state switch is provided which has four terminals, two for the A.C. power which is to be switched and two for signal input. The circuit comprises a full wave bridge rectifier having a light-activated silicon controlled rectifier connected across its D.C. terminals. A capacitor and a light-activated transistor are added to a zero-cross firing circuit whereby the solid state switch is protected from high voltage transients and is applicable for use with resistive, capacitive, and inductive loads.

9 Claims, 1 Drawing Figure

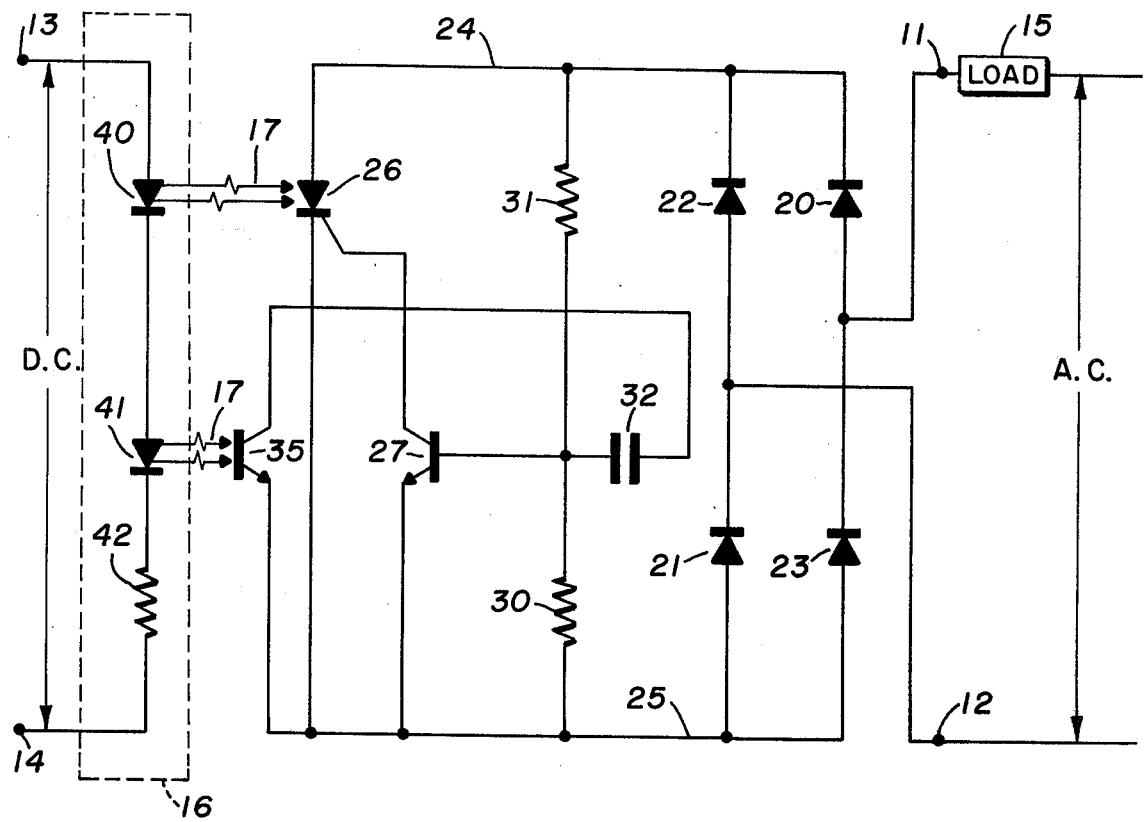

SOLID STATE SWITCH

BACKGROUND OF THE INVENTION

This invention relates, generally, to a solid state switch which utilizes a light-activated silicon controlled rectifier. More particularly, this invention relates to a solid state switch capable of reliably switching resistive, inductive, and capacitive loads.

In prior arts, the extreme sensitivity of the silicon controlled rectifier, in general, and light-activated silicon controlled rectifiers, in particular, to line noise and transients, limited their application. Any attempt to improve their performance under hostile conditions resulted in further limitations on the type of load that could be switched. Silicon controlled rectifiers are normally used to switch high currents to an A.C. load by means of controlling low currents through a PN junction of the silicon controlled rectifier, commonly called the "p-gate" or the "gate." Light-activated silicon controlled rectifiers differ from the previous description in that the gate current needed to trigger the silicon controlled rectifier is generated by an optically-coupled light emitting diode, thus enabling total isolation of the control voltage from the load voltage.

Both types of silicon controlled rectifiers inherently suffer from susceptibility to false switching due to the presence of transient noise on the A.C. line or electromagnetic interference (EMI) in the vicinity of the silicon controlled rectifier. This false switching phenomenon will deliver current to loads when no such current is called for. Many attempts have been made in the past by both the makers and users of silicon controlled rectifiers to minimize the effect of these transients on switching the silicon controlled rectifiers. The makers have used various techniques, one of which is a partial internal short between the gate and the cathode of the silicon controlled rectifier. The users revert to various circuit techniques that tend to clamp the gate of the silicon controlled rectifier to a voltage near ground (ground is considered here to be the cathode potential) or even to a negative potential. One serious drawback to these circuits is that they are applicable to use with resistive loads, but are not applicable for use with inductive or capacitive loads where a phase shift between the current and voltage is present.

SUMMARY OF THE INVENTION

It is an object of this invention to provide a solid state switch utilizing a light-activated silicon controlled rectifier.

It is a further object of this invention to provide a solid state switch circuit which will improve the performance of silicon controlled rectifiers under hostile conditions.

It is an additional object of this invention to provide a solid state switch utilizing a light-activated silicon controlled rectifier which is universally adaptable for switching any resistive, inductive or capacitive load, or any combination of resistive, inductive, and capacitive loads.

To achieve these as well as other objects, I provide a solid state switch in which a capacitor is added in a novel manner to a circuit containing a silicon controlled rectifier to enable the circuit to withstand high voltage transients and to be utilized as a switch for indictive and capacitive loads rather than being limited to resistive loads.

BRIEF DESCRIPTION OF THE DRAWING

A circuit diagram, FIG. 1, which illustrates a solid state switch incorporating the present invention is shown.

DETAILED DESCRIPTION OF PREFERRED EMBODIMENT

Referring now to the drawing, FIG. 1, there is shown a solid state switch circuit which contains four terminals 11, 12, 13, 14. Terminals 11 and 12 are the input power terminals which are to be connected through a load 15 to a source of A.C. power, for example a conventional 115 volt 60 hertz source. The load 15 is the load which is to be energized upon the "turning on" of the switch. The other two terminals, 13 and 14, of the switch are connected to an optical signal generator 16 which, upon energization of terminals 13 and 14, will produce a radiation signal, here a beam of light, schematically illustrated by lines 17. Terminals 11 and 12 are connected to the A.C. terminals of a full-wave bridge rectifier formed by the diodes 20, 21, 22, 23. Terminal 11 is connected to the anode of diode 20 and the cathode of diode 23. Terminal 12 is connected to the anode of diode 22 and the cathode of diode 21. The full-wave bridge rectifier operates to rectify the A.C. current such that the connection between the cathodes of diodes 20 and 22 is always positive with respect to the connection between the anodes of diodes 21 and 23, thus forming a positive "rail" 24 and a negative "rail" 25. The current through the diodes is determined by the total impedance between rails 24 and 25. Typically it is less than 1mA in the "OFF" state and as high as a few amps in the "ON" state, as determined by the impedance of the load.

A silicon controlled rectifier 26 is connected across the D.C. terminals of the full-wave bridge rectifier with the anode of the silicon controlled rectifier 26 being connected to the cathode of diodes 20 and 22 and the cathode of the silicon controlled rectifier 26 being connected to the anode of diodes 21 and 23; that is, the silicon controlled rectifier 26 is connected between positive rail 24 and negative rail 25. The gate of silicon controlled rectifier 26 is connected to the collector of transistor 27 which is connected within the circuit in a common-emitter configuration with the emitter connected to negative rail 25. The base of transistor 27 is connected between the resistors 30 and 31 which form a voltage divider with resistor 30 connected between the base of transistor 27 and negative rail 25 and resistor 31 connected between the base of transistor 27 and positive rail 24. Resistors 30 and 31 are typically sized such that the ratio of the resistance of resistor 31 to the resistance of resistor 30 is approximately 10:1 and the total resistance is much greater than 100,000 ohms. The function of the voltage divider network, as the name implies, is to divide the voltage appearing across rails 24 and 25 and provide a voltage at the base of transistor 27 that is well within the ratings of general purpose transistors. Transistor 27 is connected in such a manner as to monitor the magnitude of the voltage between rails 24 and 25. The transistor 27 will go into conduction when the voltage at its base reaches 0.6-0.7 volts, corresponding to a voltage of 6-7 volts between the rails 24 and 25, and stays on as long as that voltage stays above 0.6 volts. Between 0 volts and 0.6 volts the transistor 27 is "OFF." In addition to being connected between resistors 30 and 31, the base of transistor 27 is connected to one terminal of capacitor 32. The second terminal of capacitor 32 is connected to the collector of transistor 35 which is connected within the circuit in a common-emitter configuration with the emitter connected to negative rail 25.

Silicon controlled rectifier 26 and transistor 35 are each light-activated devices which are activated by a beam of light 17 from the optical signal generator 16. The optical signal generator 16 contains two light emitting diodes 40 and 41 and a current limiting resistor 42 connected in series between terminals 13 and 14. The light emitting diodes 40 and 41 could, of course, be replaced by other light generating devices including various lamps. When a D.C. voltage is impressed across terminals 13 and 14, light emitting diodes 40 and 41 will generate photons which radiate in a predetermined direction to reach the respective light-activated device: diode 40 radiates upon the gate of silicon controlled rectifier 26 to generate a gate current which, if of sufficient magnitude, will tend to trigger the silicon controlled rectifier 26 into conduction; and diode 41 radiates upon the base of transistor 35 which tends to forward bias the base-emitter junction of the transistor 35 and thereby to drive the transistor 35 into conduction.

When the silicon controlled rectifier is in the "OFF" position, that is in its non-conducting mode, it appears in the circuit as a high-impedance load which is typically greater than 1 million ohms and when it is in the "ON" position, when it is triggered into conduction, the silicon controlled rectifier appears as a low impedance path typically having an impedance of approximately 1 ohm. The silicon controlled rectifier 26 may be triggered into conduction in four ways: by applying a voltage between the anode and cathode of the silicon controlled rectifier 26, that is between the positive and negative rails 24 and 25, that exceeds the voltage rating of the silicon controlled rectifier; by applying a fast-rising voltage which rises at a rate that exceeds the voltage rise rating, the dV/dt rating, of the silicon controlled rectifier; by applying a signal to the gate of the silicon controlled rectifier that exceeds the minimum requirements for triggering the silicon controlled rectifier into conduction; and by directing a beam of light of appropriate frequency and intensity at the junction of the silicon controlled rectifier to generate a current at its gate of sufficient magnitude to trigger the silicon controlled rectifier into conduction. The last two methods are the preferred methods to trigger the silicon controlled rectifier into conduction. The first two methods are usually caused by abnormal circuit conditions and are undesirable as the silicon controlled rectifier or other circuit components may be damaged by the high voltage.

In the absence of an input signal to the light-emitting diodes 40 and 41, the silicon controlled rectifier 26 remains in its non-conductive mode and there is no current flowing in the circuit with the exception of a leakage current which is typically less than 1 milliamp. In this condition, terminals 11 and 12 could be considered as open circuit.

When a D.C. voltage is impressed across terminals 13 and 14, the light-emitting diodes 40 and 41 each generate a beam of light 17 which is proportional to the current flowing through the light-emitting diodes 40 and 41. The beams of light 17 are radiated in a predetermined direction to reach the light-activated devices located in close proximity to the light-emitting diodes 40 and 41; thus, the light beams 17 generate a current in the gate of silicon controlled rectifier 26 and the base of transistor 35. The voltage between the positive and negative rails 24 and 25 is divided by the voltage divider network of resistors 30 and 31. If the voltage between the rails 24 and 25 is less than 7 volts, the voltage at the base of the transistor 27 will be less than 0.7 volts and transistor 27 will be "OFF." This will allow the gate of silicon controlled rectifier 26 to accept the input signal, the beam of light 17 from light-emitting diode 40 and, if the signal is of sufficient magnitude, the silicon controlled rectifier 26 will be triggered into conduction. When the silicon controlled rectifier 26 is conducting, its resistance becomes virtually zero and full load current will flow through the load 15. However, when the voltage between the rails 24 and 25 is greater than 7 volts, the voltage at the base of transistor 27 will be greater than 0.7 volts and transistor 27 will normally begin to conduct. When transistor 27 conducts, the gate of silicon controlled rectifier 26 is held at a potential approximately 0.2 to 0.3 volts above the potential of the negative rail 25. As long as the gate of silicon controlled rectifier 26 is held at this potential, as long as transistor 27 is conducting, the silicon controlled rectifier 26 is prevented from being triggered into conduction.

From the above one could draw the conclusion that the circuit, the solid state switch, is designed to turn "ON" only when the A.C. voltage, the voltage between rails 24 and 25, is at or within ± 7 volts from zero crossing. Zero voltage switching is satisfactory when the load is entirely resistive in nature, but when the load contains inductive or capacitive elements, a phase difference between the current and voltage is introduced which causes unsatisfactory operation of the circuit and could lead to the destruction of many elements in it.

When the current through silicon controlled rectifier 26 decreases to below a current limit called the holding current, the silicon controlled rectifier 26 can no longer sustain itself in conduction and therefore it goes into its "OFF" or non-conducting mode. As soon as the voltage increases to supply a current higher than the holding current, the silicon controlled rectifier 26 will turn back "ON" and conduct again, provided that the external conditions do not change. The turning "ON" and "OFF" of silicon controlled rectifier 26 every half-cycle, when the current commutates, is of such a short duration that it causes no problems when switching resistive loads. However, when the load includes inductive or capacitive elements, the switching is a completely different matter. The inductive or capacitive elements in the load create a phase shift between the current and the voltage in the circuit. When the current through silicon controlled rectifier 26 decreases toward the holding current value, the silicon controlled rectifier 26 will turn "OFF" and, because of the voltage-current phase shift, a voltage will appear between the rails 24 and 25 which could be of sufficient magnitude to make transistor 27 begin conducting, thus clamping the gate of silicon controlled rectifier 26 near zero potential and preventing the silicon controlled rectifier 26 from switching "ON" and conducting. This situation will persist for the remainder of the half-cycle until the voltage goes to zero. The conduction by the silicon controlled rectifier 26 for a half-cycle and turning "OFF" for a half-cycle will generate magnetizing currents in conductive loads that could have devastating effects on the silicon controlled rectifier 26 and the remainder of the circuit.

This problem of conduction of alternate half-cycles can be alleviated by the addition of a capacitor connected in parallel with resistor 30 between the base of transistor 27 and the negative rail 25. When the current through the silicon controlled rectifier 26 decreases below the holding current and the silicon controlled rectifier 26 stops conducting, the voltage between rails 24 and 25 will rise to a percentage of its maximum value determined by the phase angle between the circuit current and voltage. The capacitor connected in parallel with resistor 30 will act as a short circuit to the fast-rising voltage. No voltage will appear at the base of transistor 27; thus, the transistor 27 remains turned "OFF" and the silicon controlled rectifier 26 can be triggered into conduction. If the signal from light-emitting diode 40 remains, the silicon controlled rectifier 26 will turn back "ON" without disrupting the power to the load 15.

However, while a capacitor connected in parallel with resistor 30 solves the problem of commutation, it creates a new problem when fast-rising transient voltages are considered. One of the desired features of the silicon controlled rectifier is to be capable of blocking fast-rising voltages appearing at its anode (i.e., that is not to allow these voltages to trigger the silicon controlled rectifier into conduction). This is normally accomplished by the transistor 27, which tends to clamp the gate of silicon controlled rectifier 26 to a near zero potential. However, if a capacitor is connected in parallel with resistor 30 as described hereinabove, the capacitor will act as a short circuit to the fast-rising voltage, thus transistor 27 will remain "OFF" which will allow the gate of silicon controlled rectifier 26 to float. Under these conditions the silicon controlled rectifier 26 is vulnerable to being triggered into conduction by the fast-rising voltage at its anode.

As described above, the switch circuit may be protected against fast-rising voltages or, by addition of a capacitor, against problems with commutation, but not both. The circuit of this invention, shown in the drawing, FIG. 1, provides a solution to both problems. The solution is accomplished by connecting one side of capacitor 32 to the base of transistor 27 and the other side of capacitor 32 to the collector of a light-activated transistor 35 which is connected in a common-emitter configuration with the emitter connected to negative rail 25. Light-activated transistor 35 is optically coupled to light-emitting diode 41 so that, when current flows through light-emitting diode 41, transistor 35 is forced into conduction by the light beams 17 from light-emitting diode 41 and the potential at the collector of transistor 35 approaches the potential at its emitter, that is the potential of the negative rail 25. Thus, when transistor 35 is conducting, transistor 35 may be viewed as a short circuit and capacitor 32 is essentially connected in parallel with resistor 30 between the base of transistor 27 and the negative rail 25.

In the absence of a D.C. signal voltage to light-emitting diode 41, transistor 35 is turned "OFF." Transistor 35, when turned "OFF," appears as an open circuit and capacitor 32 is effectively removed from the switch circuit. The appearance of any fast-rising voltage upon the positive rail 24 will turn "ON" transistor 27 and clamp the gate of the silicon controlled rectifier 26 to near zero potential so that the silicon controlled rectifier 26 can withstand the fast-rising high voltage without being triggered into conduction.

Upon the impressing of a D.C. signal voltage across terminals 13 and 14 the light-emitting diodes 40 and 41 emit light beams 17 to turn "ON" the silicon controlled rectifier 26 and transistor 35. When transistor 35 is conducting, the potential at the collector of transistor 35 approaches the potential at its emitter, that is the potential at the collector approaches the potential of the negative rail 25, and capacitor 32 is essentially connected in parallel with resistor 30 between the base of transistor 27 and the negative rail 25. The capacitor 32 is then within the switch circuit to facilitate commutation when the current and voltage are not in phase because of inductive and capacitive elements in load 15 as described hereinabove. The capacitor 32 remains in the circuit parallel to resistor 30 so long as transistor 35 is kept in its conducting mode by a signal from light-emitting diode 41. Upon removal of the D.C. input signal from terminals 13 and 14, light-emitting diode 41 ceases to emit light beams 17 and transistor 35 is turned "OFF." The turned "OFF" transistor 35 appears as an open circuit and capacitor 32 is effectively disconnected from the circuit so that transistor 27 again protects the silicon controlled rectifier 26 against fast-rising voltages by clamping the gate of the silicon controlled rectifier to near zero potential.

Removal of capacitor 32 from the circuit would limit the switch to usage with resistive loads only. Connection of capacitor 32 directly from the base of transistor 27 to the negative rail 25 would limit the capability of the switch circuit to withstand high voltage transients. The use of transistor 35 to apply capacitor 32 after the silicon controlled rectifier 26 is triggered and only for as long as an input signal is provided by light-emitting diodes 40 and 41 provides an effective solution to each of the problems: the switch is protected from the hostile operating conditions of high voltage transients and the switch may be used with loads which include inductive and capacitive elements.

Although this invention has been described with respect to the preferred embodiment, it should be understood that many variations and modifications will now be obvious to those skilled in the art; therefore, it is intended that all matter contained in the above description shall be interpreted as illustrative and not in a limiting sense.

I claim:

1. A solid state switch circuit comprising, in combination:

a pair of power terminals connectable in series with a load and in series with an A.C. source of power;

a single phase, full-wave bridge rectifier circuit having A.C. terminals and D.C. terminals; said D.C. terminals being a positive terminal and a negative terminal; said pair of power terminals connected to said A.C. terminals;

a first optically responsive conductive device having a pair of main terminals and a control terminal; said pair of main terminals of said first optically responsive conductive device being connected to said D.C. terminals of said full-wave bridge rectifier circuit;

zero-cross firing circuit means coupled between said D.C. terminals of said full-wave bridge rectifier circuit and coupled to said control terminal of said first optically responsive conductive device; said zero-cross firing circuit means having a voltage divider means;

a capacitor and a second optically responsive conductive device connected in series from a point intermediate of said voltage divider means to said negative terminal of said D.C. terminals;

and optical generator means optically coupled to said first and second optically responsive conductive devices; said optical generator means having a pair of D.C. terminals for receiving input signals for the operation of said solid state switch circuit.

2. The switch circuit of claim 1 wherein said first optically responsive conductive device comprises a light-activated silicon controlled rectifier.

3. The switch circuit of claim 1 wherein said second optically responsive conductive device comprises a light-activated transistor.

4. The switch circuit of claim 1 wherein said optical generator means comprises first and second light-emitting diodes and a current limiting resistor connected in series.

5. The switch circuit of claim 1 wherein said zero-cross firing circuit means comprises a voltage divider means in combination with a transistor; said voltage divider means comprising first and second resistors connected in series between said D.C. terminals; said first resistor being connected to said negative terminal and said second resistor being connected to said positive terminal;

said transistor having a collector, a base, and an emitter; said base being connected intermediate said first and second resistors of said voltage divider means; said emitter being connected to said negative terminal; and said collector being connected to said control terminal of said first optically responsive conductive device.

6. The switch circuit of claim 5 wherein the resistance of said second resistor is about ten times the resistance of said first resistor.

7. A solid state switch circuit comprising in combination:

a pair of power terminals connectable in series with a load and in series with an A.C. source of power;

a single phase, full-wave bridge rectifier circuit having A.C. terminals and D.C. terminals; said D.C. terminals being a positive terminal and a negative terminal; said A.C. terminals being connected to said pair of power terminals;

a light-activated silicon controlled rectifier having a pair of main terminals and a control terminal; said pair of main terminals being connected to said D.C. terminals of said full-wave bridge rectifier circuit;

zero-cross firing circuit means coupled between said D.C. terminals of said full-wave bridge rectifier circuit and coupled to said control terminal of said silicon controlled rectifier; said zero-cross firing circuit further comprising first and second resistors connected in series between said D.C. terminals; said first resistor connected to said negative terminal and said second resistor connected to said positive terminal; and a transistor having collector, base, and emitter terminals; said base being connected intermediate said first and second resistors; said emitter being connected to said negative terminal; and said collector being connected to said control terminal of said silicon controlled rectifier;

a capacitor and a light-activated transistor connected in series; said light-activated transistor having a base, for reception of energy in the form of light, and having a collector and an emitter terminal; said emitter being connected to said negative terminal of said D.C. terminals; and said capacitor being connected between a point intermediate said first and second resistors of said zero-cross firing circuit means and said collector terminal of said light-activated transistor;

and optical generator means; said optical generator means further comprising first and second light-emitting diodes and a current limiting resistor connected in series; said first light-emitting diode being optically coupled to said light-activated silicon controlled rectifier and said second light-emitting diode being optically connected to said light-activated transistor; said optical generator means having a pair of D.C. terminals for receiving input signals for the operation of said solid state switch.

8. In a solid state switch circuit having in combination:

a pair of power terminals connectable in series with a load and in series with an A.C. source of power;

a single phase, full-wave bridge rectifier circuit having A.C. terminals and D.C. terminals; said D.C. terminals being a positive terminal and a negative terminal; said pair of power terminals connected to said A.C. terminals;

a first optically responsive conductive device having a pair of main terminals and a control terminal; said pair of main terminals of said first optically responsive conductive device being connected to said D.C. terminals of said full-wave bridge rectifier circuit;

zero-cross firing circuit means coupled between said D.C. terminals of said full-wave bridge rectifier circuit and coupled to said control terminal of said first optically responsive conductive device; said zero-cross firing circuit means having a voltage divider means;

and optical generator means; said optical generator means having a pair of D.C. terminals for receiving input signals for the operation of said solid switch circuit; the improvement comprising:

a capacitor and a second optically responsive conductive device connected in series from a point intermediate of said voltage divider means to said negative terminal of said D.C. terminals; whereby said solid state switch may be used with loads which include inductive and capacitive elements.

9. The switch circuit of claim 8 wherein said second optically responsive conductive device comprises a light-activated transistor.

* * * * *